United States Patent [19]

Smith et al.

[11] 3,986,116

[45] Oct. 12, 1976

[54] TRANSIENT SOURCE AND DIRECTION OF PROPAGATION DETECTOR

[75] Inventors: Maurice N. Smith, Oxnard; Kwang-Ta Huang, Port Hueneme, both of Calif.

[73] Assignee: The United States of America as represented by the Secretary of the Navy, Washington, D.C.

[22] Filed: Jan. 27, 1975

[21] Appl. No.: 544,428

[52] U.S. Cl. ................................ 324/102; 324/52; 324/127; 324/133
[51] Int. Cl.[2] ................... G01R 19/14; G01R 31/08
[58] Field of Search ............... 324/102, 133, 52, 66, 324/67, 127

[56] References Cited
UNITED STATES PATENTS 3,753,089  8/1973  Gunn et al. ........................ 324/133
3,838,339  9/1974  Brandt .............................. 324/133

*Primary Examiner*—R. V. Rolinec
*Assistant Examiner*—Ernest F. Karlsen
*Attorney, Agent, or Firm*—Richard S. Sciascia; Joseph M. St.Amand; David O'Reilly

[57] ABSTRACT

A detector for locating the direction of propagation of transients on electrical power lines supplying critical loads having various types of random impulse voltage transients. The device detects the polarity of transient voltages and the direction of transient current. An integrated logic and control circuit compares the sampled voltage and current to indicate from which direction the transient came. The logic and control circuit activates indicator lights which show whether the transient occurred in the direction of the source or the load and whether the transient was positive or negative.

12 Claims, 5 Drawing Figures

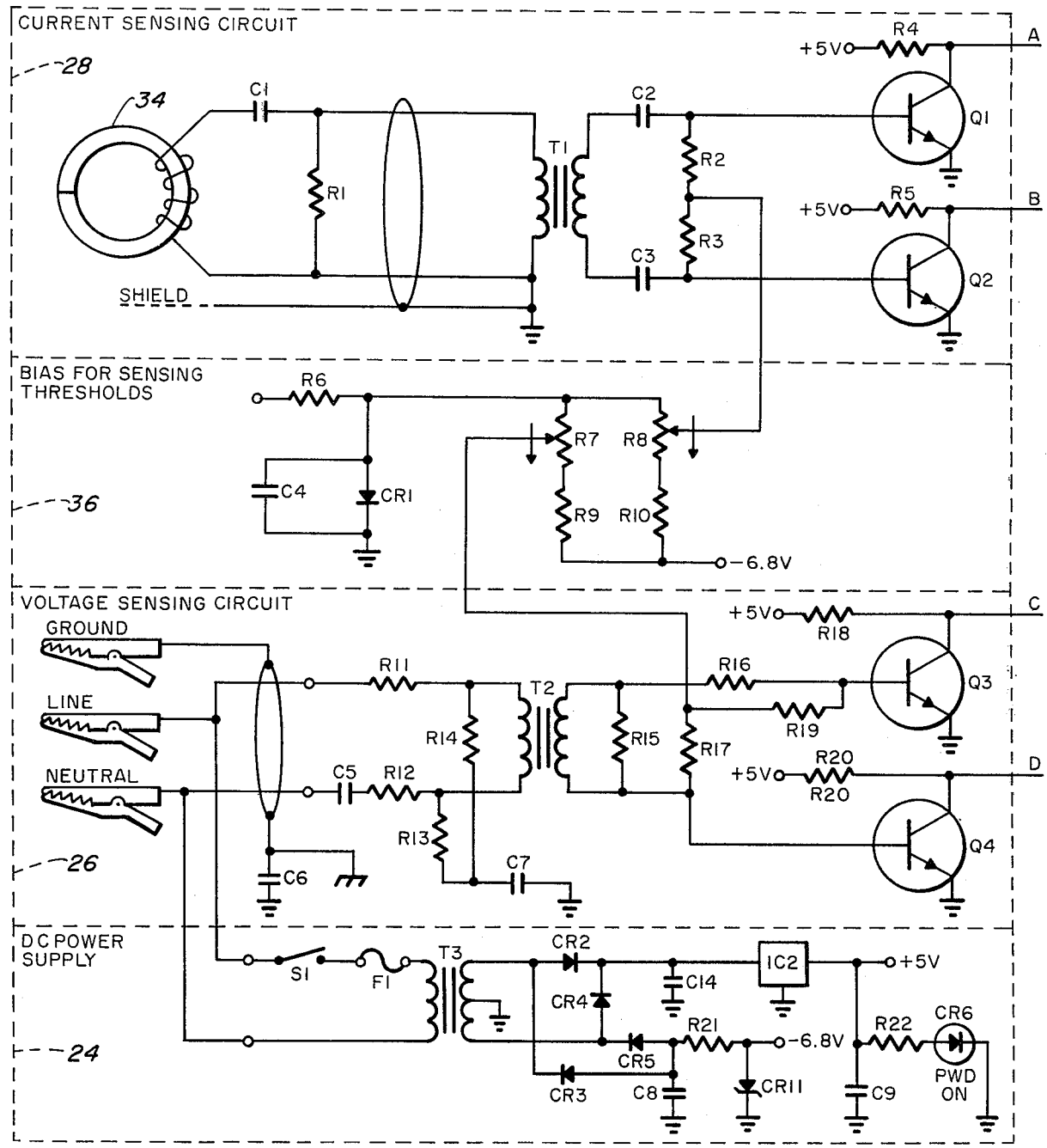

TRANSIENT SOURCE AND DIRECTION OF PROPAGATION DETECTOR

BACKGROUND OF THE INVENTION

This invention relates generally to devices for detecting power line disturbances and more particularly relates to devices for analyzing transient voltages and currents in power supplied to critical electronic equipment.

As the use of computers and other critically sensitive electronic equipment comes more and more into use, a need for detecting and eliminating power line disturbances such as transient voltages and currents has been shown. Presently, devices for detecting disturbances and transients are of the type which shut down the equipment to prevent damage and provide no information as to the origin of the disturbance. For example, computers frequently have overload protecting devices which will shut down the equipment to protect the electronic circuitry and the memory data banks. However, if the source of the transient is not discovered, frequent recurrence can result in considerable down time, resulting in costly operation of the electronic equipment. The very nature of transients (i.e., occuring infrequently) makes it difficult to determine their origin.

It has been established that electrical power in supplying critical equipment have various types of random impulse voltage transients. These transients can cause numerous problems to critical loads such as operational failures, physical damage, errors in computer printouts, etc. Numerous devices are available to establish that impulse voltage transients are occurring, such as the power line monitoring equipment that detects and records these transients so that a correlation can be made with equipment failures, which is the subject of U.S. Pat. No. 3,813,667 of M. Smith, who is one of the co-inventors in this invention. However, no known method was available to determine the source of the majority of these random type transients. It was also suspected that many impulse voltage transients are generated by the critical loads. A need, therefore, existed to determine the source of these transients. This need resulted in the development of the Transient Direction Detector of Patent Application Ser. No. 542,478 filed on Jan. 20, 1975 by K. T. Huang, who is a co-inventor in this invention. This invention is an improved version of the Transient Direction Detector of the patent application mentioned above.

SUMMARY OF THE INVENTION

The purpose of this invention is to determine the direction of propagation of impulse transients on a line so that they may be located and the condition causing the transient corrected. The transient direction detector is comprised of current and voltage probes, current and voltage sensing circuits, logic and control circuitry, and direction and polarity visual indicating devices. The system also includes automatic or manual reset switch and a reset button. In addition, there is an interface plug provided so that the transient direction detector can be used with the power line monitor of U.S. Pat. No. 3,813,667 by M. Smith. The detector input voltage requirements are 120 VAC, single-phase 50–60 hz, which is supplied to a power supply in the detector through the voltage probe.

The detector determines the direction of propagation of transients on a line by sensing the direction of transient current and comparing it with the polarity of the transient voltage. This is possible because the transient current and transient voltage are in phase at the time the impulse occurs and because transient current flows from the high side of the transient to the low side. For example, a positive transient occurring at the source will produce a positive voltage pulse and a current flowing from the source to the load. Thus, the current sensing circuit of the detector will indicate current flowing from the source to the load while the voltage sensing circuit will indicate that the transient was positive. When this information is analyzed in a logic and control circuit, it will indicate that the transient occurred at the source. The detector senses the direction of the transient current by sampling the current and producing a positive or negative pulse which represents the direction of the current. That is, the current probe must be defined as producing a positive pulse for current in one direction and producing a negative pulse for current in the opposite direction (i.e., polarized). The voltage sensing circuit merely senses the polarity of a sample of the transient voltage collected by the voltage probe. The polarity of the voltage sample directly indicates the polarity of the transient impulse. When the voltage sample and current sample are compared in the logic and control circuit, the comparison indicates the origin of the transient. The logic and control circuit activates an indicating panel having lights which show whether the transient occurred in the direction of the source or the load and its polarity.

OBJECTS OF THE INVENTION

It is one object of the present invention to provide a system for detecting transients on a power line.

Another object of the present invention is to detect the direction of propagation of impulse transients on a power line.

Still another object of the present invention is to detect the direction of transients on a power line and indicate the polarity of the transient.

Another object of the present invention is to detect transients on a power line and determine the direction of transient current.

Still another object of the present invention is to provide a transient detection system which will detect the polarity of transient voltage on a power line.

Yet another object of the present invention is to provide a transient detector system which will analyze the transient voltage polarity sampled and compare it with the transient current sample to determine the origin of the impulse transient.

These and other objects and novel features of the invention will become apparent from the following detailed description of the invention when considered in conjunction with the accompanying drawings.

BRIEF DESCRIPTION OF THE DRAWINGS

FIG. 2 is a logic table indicating the relationship of the transient voltage and current for each flow diagram of FIG. 1.

FIGS. 4a and 4b are detailed schematic diagrams of the various circuits of the transient direction detector system.

DETAILED DESCRIPTION OF THE PREFERRED EMBODIMENT

Figure 1:
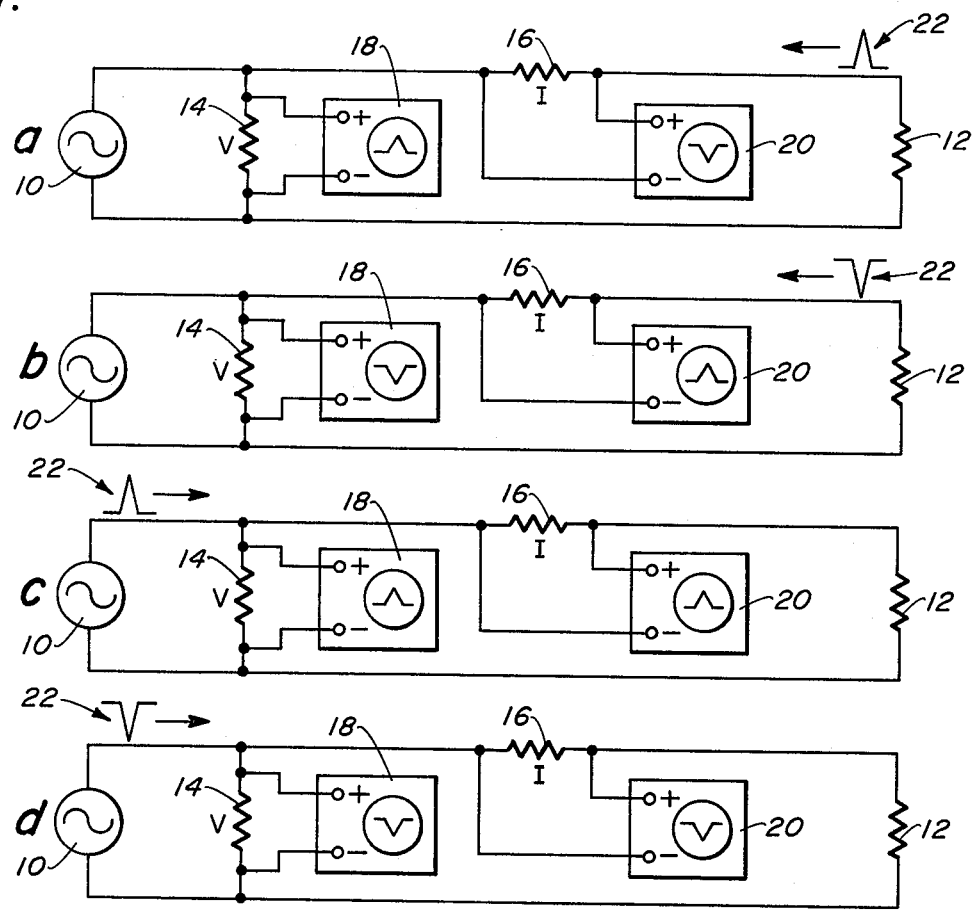
FIGS. 1a through 1d are electrical flow diagrams demonstrating the theory of the transient direction detector.

The principle of operation of the transient direction detector can be demonstrated by referring to the polarity flow diagrams of the FIG. 1. In FIG. 1, a simple analogous circuit is shown merely to demonstrate how the transient direction detector functions, with a pair of resistors 14, 16 representing the transformers actually used. In FIG. 1, a source is shown at 10 and a load at 12 with resistors 14 and 16 in place of the transformers used in the actual circuit. A voltage measuring device 18 and current measuring device 20 (e.g., an oscilloscope) are connected across resistors 14 and 16, respectively. FIGS. 1a through 1d are identical and show four possible combinations of current and voltage transients that may occur on a power line and the polarity of each across the resistors 14 and 16 as they would appear at the output of the voltage and current transformers. The capital V next to resistor 14 and a capital I next to resistor 16 indicate that measuring devices 18 and 20 measure voltage and current, respectively. Now, if a positive impulse transient (indicated at 22) occurs at the load, a negative polarity pulse would appear on current measuring device 20, and a positive polarity pulse would appear on voltage measuring device 18.

Figure 4B:
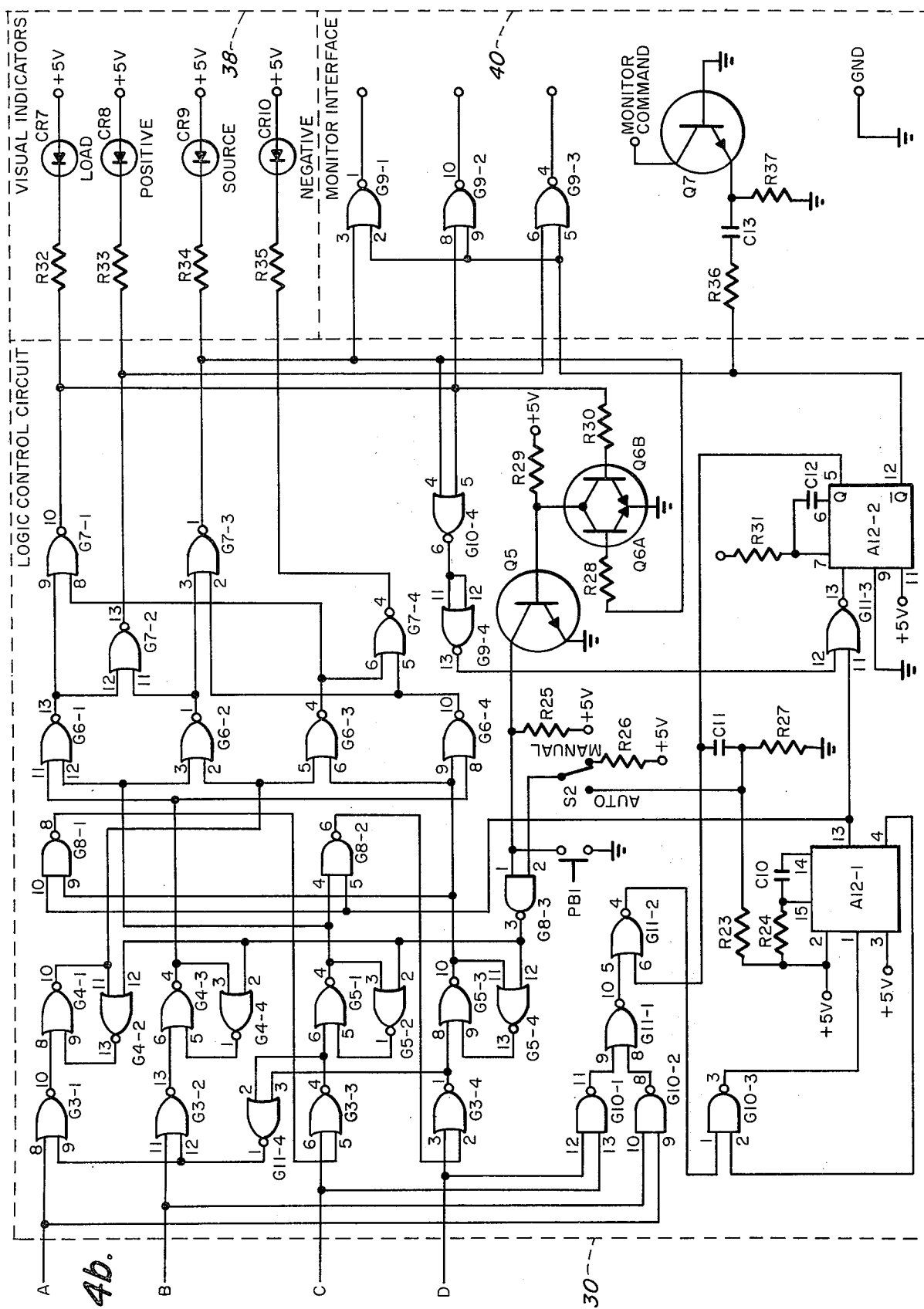

In FIG. 4b, the circuit is the same except that the impulse transient 22 is negative in polarity and occurs at the load. In this case, the voltage measuring device indicates a pulse negative in polarity and the current measuring device indicates a positive polarity pulse. FIGS. 1c and 1d again are identical circuits except that the impulse transient 22 is a positive pulse occurring at the source 10 in FIG. 1c and a negative polarity pulse 22 occurring at the source 10 in FIG. 1d.

The transient current sampled by the current measuring device 20 will be reversed in polarity for a transient pulse occurring at the load (FIGS. 1a and 1b) but will have the same polarity as a transient pulse occurring at the source 10 (FIGS. 1c and 1d). This shows that a transient generated from the load, regardless of its polarity, will always produce pulses in the voltage and current measuring devices of opposite polarities. A transient occurring at the source, regardless of its polarity, will always produce pulses in the voltage measuring device 18 and current measuring device 20 of the same polarities. By using a logic circuit that can correctly sense these polarities, it is possible to identify the direction of propagation of the transient along a power line.

The table of FIG. 2 indicates the manner in which the logic circuit would determine the origin of the transient according to the polarity of the voltage and current sensing devices. The table shows that for FIG. 1a, a positive voltage will be sensed while a negative current will be sensed, indicating that the origin of the transient is the load and that the polarity of the transient is positive. For FIG. 1b, the voltage will be negative, the current positive, and the origin again will be the load with the transient polarity indicated as negative. For FIGS. 1c and 1d, the voltage and current will be in phase, indicating the origin as the source with the transient polarity indicated as positive and negative, respectively.

The waveforms, however, of the voltage and current transients are only in phase for a short period after the transient occurs. Therefore, using the polarities of the voltage and current transients for detecting the transient direction is valid only for a short duration after the transient occurs. Thus, the detector has to provide an automatic blocking circuit to prevent interruption of the logic circuit until after an initial signal has activated the logic circuit. Furthermore, the direction of propagation is detected by establishing the polarities of both current and voltage transients at the time the transient occurred. For a high impedance load, the initial transient current may be very small and below a preset threshold level, at which point the detection of propagation of its transient cannot be detected. This can be corrected by connection of a capacitor in parallel with a high impedance load.

Figure 3:
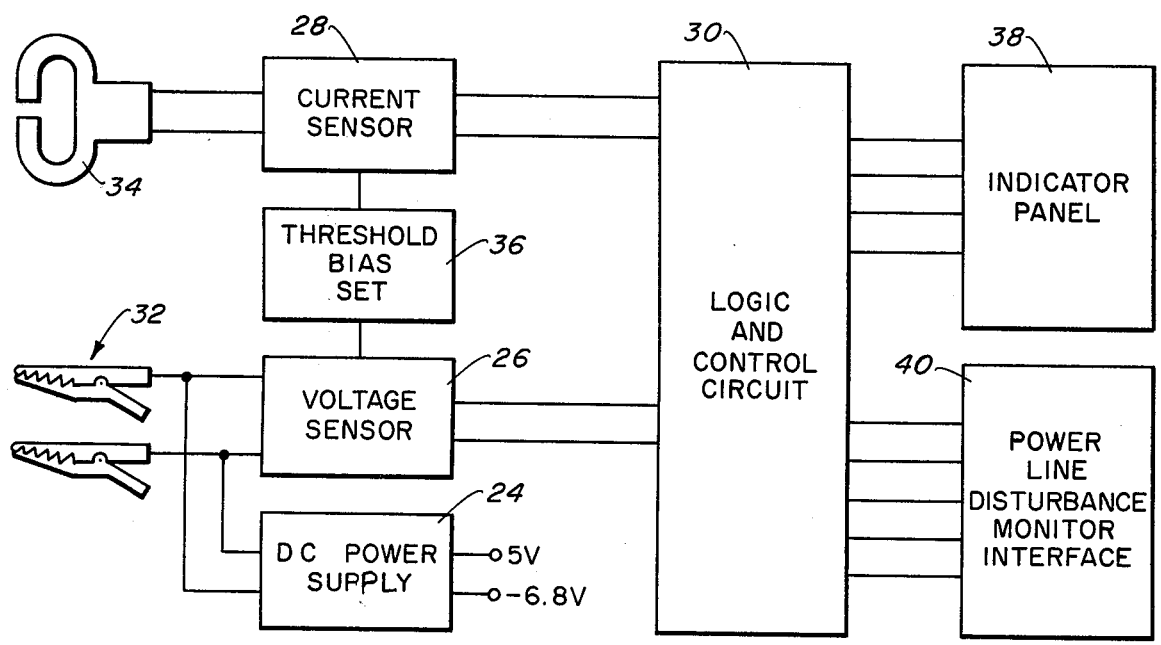
FIG. 3 is a block diagram of the transient direction detector system of the present invention.

As shown in FIG. 3, the detector system is divided into four major sections: power supply 24, voltage sensing circuit 26, current sensing circuit 28, and logic and control circuit 30. Operating in conjunction with these four major networks are voltage probe (indicated at 32), current probe 34, threshold bias setting circuit 36, indicator panel 38, and power line disturbance monitor interface 40.

The power supply section 24 has its own a.c. power supply which is connected to the 120 a.c. volt source through the voltage probe 32. This power supply 24 has two d.c. outputs, a regulated plus 5 d.c. volt supply for the detector and a regulated −6.8 d.c. volt source to provide a voltage bias in the current and voltage sensing sections 26 and 28, respectively. An on-off switch S1 and current limiting fuze F1 is series-connected to the input a.c. terminals of the power supply to protect the detector.

A split-core clamp-on device is utilized as a current probe to provide a current sample to the current sensing circuit 28. In order to provide a proper reading of the direction of the impulse transient, the current sampling probe must be marked to indicate the proper polarity. This can be done by marking one side of the device "source" and the other side "load," if desired. The current probe 34 must be clamped on the same phase conductor of the power line that the voltage probe 32 is connected to, with the side marked "source" facing the source of the power, and the side marked "load" facing the load side of the line. The pulse transformer T1, shown in FIG. 4, will transmit the transient current signal from the current probe to two biased transistors Q1 and Q2. The base of these two transistors Q1 and Q2 are biased at a selected voltage level by threshold bias setting circuit 36 such that transients having peak voltages above this level will activate one or the other of these two transistors Q1 and Q2, depending upon the polarity of the transient. Thus, a positive polarity transient will activate transistor Q1 while a negative polarity will activate Q2. The activation of either transistor Q1 or Q2 will transmit a signal to the logic and control circuit 30.

The input to the voltage sensing circuit 26 is comprised of three leads indicated at 32. The input end of each lead is connected to a clamp. The three leads are marked "line," "neutral," and "ground," respectively. The leads marked with "line" and "neutral" are enclosed in a shielded cable with the shield connected to the ground lead. The markings on the input leads of the voltage sensing section assure a proper connection of the leads to the power line in the same phase relationship as the current probe 34. The operation of the transistors Q3 and Q4 are the same as for the transistors Q1 and Q2 of the current sensing circuit.

The logic and control circuit 30 activates the appropriate direction indicating lights (light emitting diodes) on the indicator panel 38 corresponding to the polarities of transient signals received from the voltage and current sensing section. The logic and control circuit 30 controls the time that the input signals from current and voltage sensing circuits 26 and 28 are allowed to enter the logic circuit. Thus, other input signals will not disturb the logic circuit after activation and while it is analyzing an impulse transient. An additional function of the logic and control circuit of this invention is to provide a print command in binary coded decimal code (BCD) signals to a power line disturbance monitor interface panel 40. This panel can be connected to the power line disturbance monitor disclosed in U.S. Pat. No. 3,813,667 for printing of the information processed by the transient direction detector. The schematic of FIG. 4 shows in detail the connecting and operating of the transient direction detector. The power supply is a 120 volt a.c. input from the voltage probe 32. Transformer T3 in the power supply has a center tap in the secondary with an output of approximately 24 VAC. CR2 and CR4 form a fullwave rectifier with an output of approximately +12 VDC. The +12 VDC is regulated to a +5 VDC output by integrated circuit regulator IC2. The +5 VDC terminal is also connected with a light emitting diode CR7 to indicate the power is on. R22 is a current limiting resistor for light emitting diode CR7. CR3 and CR5 form a fullwave rectifier with an output of approximately −12 VDC. The −12 VDC is also regulated to a −6.8 volts by resistor R21 and zener diode CR6.

The current probe 34 is a shielded cable with a clamp-on device at the power line end. The clamp-on device is a split-core current transformer. Each side of the handle of the clamp-on current transformer has polarity markings or either source or load. For proper operation of the detector, when the clamp-on transformer is clamped on a power line, the side marked "load" or "negative" must be facing the load side of the line and the side marked "source" are positive, must face the source side of the line. A clamping device which can be clamped on a cable size up to 450 MCM is desirable. An attenuator network comprised of resistor R1 and capacitor C1 is provided at the input of current pulse transformer T1. The secondary side of pulse transformer T1 has filter capacitors C2 and C3 connected to the base of transistors Q1 and Q2. Transistor Q1 conducts when a positive pulse appears on the line and transistor Q2 conducts when a negative pulse appears on the power line. Biasing of transistors Q1 and Q2 is accomplished by adjusting potentiometer R8 in the threshold bias setting circuit 36.

The voltage probe 32 is a two-conductor shielded cable with the shield used as a ground lead. The three clip leads at the power line end of the voltage probe are appropriately marked "line," "neutral," and "ground." Care must be exercised for proper connection to ensure proper operation of the detector. R11, R12, R13, R14 and C5 form an attenuator network on the primary of voltage pulse transformer T2. C7 acts as a high impedance to the line 60 hz power. Voltage pulse transformer T2 is a one-to-one pulse transformer with R15 across the secondary as a swamping resistor. The terminals of the secondary of pulse transformer T2 are connected to the bases of transistors Q3 and Q4, respectively. R16 is used to provide a resistance, preventing a d.c. short between the bases of the two transistors. R17 and R19 form a voltage divider so that transistors Q3 and Q4 are both equally biased to the same level. The bias level of the two transistors is determined by adjusting potentiometer R7 in the threshold bias setting circuit 36. Each transistor is biased to a cut-off condition so that it requires a positive level voltage to cause them to conduct. If a positive pulse appears on the power line that the voltage probe 32 is connected to, the pulse will be transformed from the primary to the secondary of transformer T2. It will then appear positive on the base of transistor Q3 and, if of sufficient amplitude, it will cause transistor Q3 to conduct. This same pulse will appear negative on the base of transistor Q4, causing no change in the cut-off state. If a negative pulse appears on the power line, the transistor Q4 will conduct and transistor Q3 will remain in the cut-off state.

The logic and control circuit 30 is comprised of quadruple two-input positive NAND gates G8 and G10, quadruple two-input positive NOR gates G3, G4, G5, G6, G7 and G11, and a dual monostable multivibrator A12. Integrated circuit G3 is used to furnish the set signals to reset-set (RS) flip-flops formed by integrated circuits G4 and G5. The reset signal for these RS flip-flops is supplied by integrated circuit G8-3. NAND gates G10-1, G10-2, G10-3 and NOR gates G11-1 and G11-2 are used to furnish the trigger pulse for monostable multivibrator A12-1 and to initiate the reset output of G8-3 at the start of each operation of the detector. A signal flow through the circuitry will best illustrate the operation of the detector.

With the detector properly connected to a power line (i.e., voltage probe 32 and current probe 34 properly connected) and a positive transient pulse appearing on the line from the source, the following will occur. As the positive pulse passes the current probe 34, a positive pulse will appear on the base of Q1 and a negative pulse will appear on the base of Q2. Q2 will remain in a cut-off condition leaving its collector in a high state. Pin 11 of G3-2 and pin 10 of G10-2, which is connected to the collector of Q2, then remains in a high state. The positive pulse that appeared on the base of Q1 will drive pin 8 of G3-1 and pin 9 of G10-2 to a low state. Simultaneously a positive pulse travels through the voltage probe and appears as a positive pulse on the base of Q3 and a negative pulse on the base of Q4. The negative pulse on Q4 causes no change on its collector voltage and thus it remains in high state. Pin 3 of G3-4 and pin 12 of G10-1 are connected to the collector of Q4 so they remain in a high state. The positive pulse that appears on the base of Q3 will reverse the state of its collector to a low state. Because this collector is directly connected to G3-3, pin 6, and G10-1, pin 13, it drives both of these pins to a low state. With G10-1, pin 13, and G10-2, pin 9, low, both of their outputs (pins 11 and 8) which are normally low, will go to a high state. These two outputs are directly connected to the inputs of G11-1, pins 9 and 8. With these two inputs simultaneously high the output of G11-1, pin 10, which is normally high, will go to a low state. G11-2 input pin 5, which is normally high, is driven low. G11-2 input pin 6 is normally low and remains in a low state. Now with both pins 5 and 6 simultaneously in a low state, the output of G11-2, pin 4, which is normally low, goes high. Pin 4 of G11-2 is directly connected to pin 1 of G10-3, which is normally in a low state. Pin 2 of G10-3 is normally in a high state. With pins 1 and 2 of G10-3 simultaneously in a high state, the output pin 3 goes low.

Pin 3 of G10-3 is directly connected to pin 1 of A12-1 and pin 2 of G8-3 through switch S2, which should be in the auto (i.e., automatic) position. when pin 1 of A12-1 goes low, it triggers the monostable multivibrator A12-1. The RC combination of R24 and C10 gives a 2 microsecond state change on outputs pins 4 and 13. Pin 13 is normally low and pin 4 is normally high. When A12-1 is triggered, pin 4 goes low and pin 13 goes high for approximately 2 microseconds. The 2 microsecond low pulse from pin 4 of A12-1 is directly connected to pin 2 of G10-3, immediately causing the output of G10-3 to go back to its normally high state. Thus, the negative state of pin 3 of G10-3 that triggered A12-1 is of very short duration (nanoseconds). This same pulse also appears on pin 2 of G8-3 which causes the output of G8-3, pin 3, to go positive for this nanosecond duration. Pin 3 of G8-3 is directly connected to pins 12 and 2 of G5 and pins 2 and 12 of G4. These are the reset inputs for the RS flip-flops which reset the logic circuitry. This operation is accomplished during the rise of the pulse that appeared on the power line.

As stated before, when A12-1 was triggered and pin 4 went low, pin 13 goes high for approximately 2 microseconds. Pin 13 of A12-1 is directly connected to pin 11 of G11-3, pin 5 of G8-2 and pin 10 of G8-1. Pin 4 of G8-2 is normally high and pin 5 normally low, so when the 2 microsecond pulse appears on pin 5, both pin 5 and 4 are simultaneously high, causing the output on pin 6 to go low. Pin 2 of G3-4, which is normally high, is driven low by the output of G8-2, pin 6. Pin 3 of G3-4 is normally high and remains high because the positive pulse that occurred on the power line did not cause Q4 to conduct. With pin 3 of G3-4 remaining high and pin 2 going low, there is no change of state on the output pin 1. With pin 1 of G3-4 remaining in the same state, the RS flip-flop formed by G5-3 and G5-4 remains in the same state. Thus, pin 9 of G8-1 remains in a high state.

The positive 2 microsecond pulse from pin 13 of A12-1 appears on pin 10 of G8-1, causing the output on pin 8, which is normally high, to go to a low state. Pin 8 of G8-1 is directly connected to pin 5 of G3-3. Pin 6 of G3-3 was driven to a low state by G1-3 when the positive pulse occurred on the power line. So, simultaneously pins 5 and 6 of G3-3 are in a low state. This causes the output of G3-3, pin 4, which is normally low, to go high. Pin 4 of G3-3 is directly connected to pin 6 of G5-1 and pin 2 of G11-4. G5-1 and G5-2 form an RS flip-flop with pin 6 of G5-1 being the set input of the flip-flop. When pin 6 went high, this causes the output of the RS flip-flop, pin 4, which is normally high, to go low. This output will remain in a low state until a reset pulse appears on the reset input pin 2 of G5-2.

The output of the RS flip-flop, pin 4, is directly connected to pin 4 of G8-2, pin 12 of G6-1 and pin 3 of G6-2. When pin 4 of G8-2 is driven low, this occurs while the 2 microsecond positive pulse from pin 13 of A12-1 is still present on pin 5 of G8-2. This causes the output of G8-2 pin 6 to go high, further ensuring that G3-4 does not change state on its output. Simultaneously while this occurs, the set signal from pin 4 of G3-3 appears on pin 2 of G11-4, which is normally low. Pin 3 of G11-4 is also normally low and remains low because G3-4's output did not change state. With pin 2 of G11-4 going high, the output pin 1, which is nor-
mally high, goes low. Pin 1 is directly connected to pin 12 of G3-2 and pin 9 of G3-1. With pin 12 of G3-2 going low but pin 11 remaining high because of the positive pulse appearing on the power line, G3-2 does not change state and remains low. Pin 9 of G3-1 is driven low by the output of G11-4 simultaneously with the low on pin 8 of G3-1 caused by the positive pulse appearing on the power line which caused Q1 to conduct. With pins 8 and 9 of G3-1 low, its output pin 10 changes state and goes high. This triggers the RS flip-flop consisting of G4-1 and G4-2. The output of the RS flip-flop goes from a normal high to a low and will remain in this low state until a reset pulse appears on pin 12 of G4-2. The output of RS flip-flop, pin 10 of G4-1, is directly connected to pin 2 of G6-2 and pin 5 of G6-3, thus driving both pins to a low state. Now there is a condition where the output of two RS flip-flops are low and two are high.

Next we move to the input pins of the 4 NOR gates G6-1, 2, 3 and 4. On G6-1 input pin 11 is high while pin 12 is low, so the output reamins low. On G6-2, both inputs are simultaneously low changing the normally low output to a high state. On G6-3 one input is low and the other high, so there is no change in its output. On G6-4, the output does not change because both inputs are high. With both inputs of G6-2 low, its output pin 1 goes high. Pin 1 of G6-2 is directly connected to pin 11 of G7-2 and pin 2 of G7-3, thus both these pins go high. With pin 2 of G7-3 high and pin 3 in its normally low state, the output pin 1, which is normally high, goes low. The low on pin 1 causes current to flow through light emitting diode CR9, which glows, indicating the transient that appeared on the power line was from the source. Also, with pin 11 of G7-2 high and pin 12 in its normally low state, its output pin 13 goes low. The low on pin 13 causes current to flow through light emitting diode CR8, making it glow, indicating that the transient was positive.

Pin 1 of G7-3 is also connected directly to pin 3 of G9-1 and pin 4 of G10-4, thus driving both of these pins low. When pin 4 of G10-4 goes low with pin 5 normally high, output pin 6 goes high. This output is directly connected to both input pins 11 and 12 of G9-4. With both of these pins high, the normally high output pin 13, which is directly connected to pin 12 of G11-3, goes low. Input pin 11 of G11-3 has the 2 microsecond positive pulse from A12-1, pin 13 with pin 12 now low, the output of G11-3, pin 13, does not change state for the duration of the 2 microsecond pulse. At the end of the 2 microsecond pulse, the output of G11-3 goes high, triggering monostable multivibrator A12-2.

The RC combination of R3 and C12 allows A12-2 to turn on for approximately 150 milliseconds, allowing normally low pin 5 to go high for the 150 millisecond period. The high on pin 5 is directly connected to G11-2, pin 6, preventing G11-2 from changing state during the time pin 6 is high. Thus, logic circuit 30 will remain in its present state for that period of time. This is done to permit the detector to be used in conjunction with the power line disturbance monitor referred to above. The 150 millisecond time period allows the monitor time to record the output of the detector. G9-1, 2 and 3 provide a BCD output to monitor interface 40. The input pins to G7-1, 2 and 3 are normally low and the output pins are normally high. Input pins 2, 9 and 5 of G9-1, 2 and 3 are connected together and also to pin 12 of A12-2. When A12-2 is triggered normally high, pin 12 goes low for 150 milliseconds. This drives pins 2, 9 and 5 of G9-1, 2 and 3 low for 150 milliseconds. Both input pins of the G9 NOR gates must be low simultaneously for their output to change state. Remember that the positive pulse and source disturbance light emitting diodes CR8, CR9 are glowing because G7-2 and G7-3's outputs are low. G7-2's output is also connected to input pin 6 of G9-3 and G7-3's output is also connected to input pin 3 of G9-1. With the other input pins of G9-1 and G9-3 low because of the 150 millisecond low from pin 12 of A12-2, the outputs of G9-1 and G9-3 change to a high state for the 150 millisecond period. The output of pin 12, A12-2, is also coupled to the emitter of Q7, which provides a command signal to the monitor when it is connected to the detector. When the monitor is connected and receives the command signal BCD of G9-1 and G9-3 (i.e., positive output) will be recorded by the monitor. The light emitting diodes CR8 and CR9 will remain glowing until the next transient occurs or until the data reset switch PB1 is pushed. When PB1 is pushed, it grounds pin 1 of G8-3, causing the output of G8-3, pin 3, to go high which resets the RS flip-flops, putting the logic circuit back to its quiescent state ready for the next operation.

Q5 and Q6 prevent an erroneous signal in indicating panel 38 and monitor interface 40. The outputs of G7-1, pin 10, and G7-3, pin 1, are normally high preventing both the load and source indicators CR7 and CR9 from glowing. When either indicator CR7 or CR9 glows, the respective output of G7-1 or G7-3 is low. These outputs are connected to the base of the two transistors forming Q6 through resistors R28 and R30. Normally the output of Q6 (collectors) is low. When either input goes low, the output (i.e., Q6 collectors) remains in a low state. But if both inputs (bases) simultaneously go low (i.e., both the source and load disturbance indicators were to conduct, giving an invalid direction indication), the output of Q13 will go high, driving the base of Q5 high. This causes Q5 to turn on, driving its collector low which is connected to G8-3, pin 1. This drives G8-3, pin 3, high, which resets all the RS flip-flops, cancelling out all logic information. The power disturbance monitor, if connected, will indicate that the direction was undetermined.

Capacitor C11 connected to multivibrator A12-2, pin 5, and gate G11-2, pin 6, along with R23 and R27, provides a differential hold-off pulse at the end of the 150 millisecond period to reset the logic and control circuit when switch S2 is in the auto position. The power line disturbance monitor may or may not be used with the transient direction detector, as desired. If the operator wishes to have a permanent record of the information gathered by the transient direction detector recorded, then the power line disturbance monitor will be connected to the transient direction detector through power line disturbance monitor interface 40.

The following part numbers are given merely by way of example for some components of the transient direction detector:

| 1. NAND gates (G8, G10) | SN 7400 |
| 2. NOR gates (G3-G7, G11) | SN 7402 |
| 3. Multivibrator (A12) | SN 74123 |
| 4. Voltage Regulator (IC2) | LM 309 |

Obviously many modifications and variations of the present invention are possible in light of the above teachings. It is therefore to be understood that within the scope of the appended claims the invention may be practiced otherwise than as specifically described.

We claim:
1. A system for detecting the origin of impulse transients on a line, comprising:
   a. transient current sensing means;
   b. transient voltage sensing means;
   c. means for setting the threshold level of the transient current and voltage sensing means;
   d. logic means for comparing the sensed transient current and voltage; and
   e. indicating means activated by said logic means to indicate the direction of origin and polarity of the transient.
2. The transient detector of claim 1 wherein said transient current sensing means comprises:
   a. a split-core transient current sampling probe marked for connection on a power line in a predetermined direction;
   b. a pulse transformer producing a pulse from the current sample; and
   c. means for detecting the polarity of the current pulse.
3. The transient detector of claim 2 wherein the transient voltage sensing means comprises:
   a. a pair of transient voltage sampling clips for attachment across a power line in a predetermined direction relative to the current probe;
   b. a pulse transformer producing a pulse from the voltage sample; and
   c. means for detecting the polarity of the voltage pulse.
4. The transient detector of claim 3 wherein the means for detecting the polarity of the current pulse and voltage pulse comprises:
   a. a transistor in each line of the secondary of each pulse transformer having its base connected to the transformer; and
   b. said threshold setting means comprises an adjustable bias voltage applied to the base of each transistor through a potentiometer.
5. The transient detector of claim 1 wherein said logic means comprises:
   a. a logic circuit for comparing the polarity of the transient current pulse with the polarity of the transient voltage pulse; and
   b. means for blocking inputs to the logic means until the transient has been analyzed.
6. The transient detector of claim 5 wherein said means for blocking inputs to the logic means includes reset means.
7. The transient detector of claim 6 wherein the reset means includes:
   a. a first switch for selecting automatic or manual reset; and
   b. a second switch for activating reset when the first switch is in the manual position.
8. A method of detecting the origin of an impulse transient comprising:
   a. sensing the direction of current produced by a transient;
   b. sensing the polarity of voltage produced by a transient;
   c. setting the threshold of the transient current and voltage sensing means;
   d. comparing the direction of the transient current with the polarity of the transient voltage in a logic circuit;

e. activating an indicating circuit according to the direction of the origin of the transient determined in the logic circuit; and f. indicating the polarity of the transient.

9. The method of claim 8 wherein the step of sensing the direction of transient current comprises:

a. sampling the transient current with a probe;

b. producing a pulse from the transient current sample; and c. sensing the polarity of the pulse produced, the polarity of said pulse being indicative of the direction of transient current.

10. The method according to claim 9 wherein the step of sensing the polarity of the transient voltage comprises:

a. sampling the transient voltage with a voltage probe;

b. producing a pulse in phase with the transient voltage; and c. detecting the polarity of the voltage pulse.

11. The method of claim 10 wherein said step of comparing the transient current and voltage comprises:

a. comparing the polarities of the transient current pulse and transient voltage pulse; and b. blocking inputs to logic circuit until the direction of origin of the transient is indicated.

12. The method of claim 11 including resetting the logic circuit after a predetermined time.

* * * * *